United States Patent [19]
deJong et al.

[11] Patent Number: 5,150,115
[45] Date of Patent: Sep. 22, 1992

[54] INDUCTIVE TYPE INCREMENTAL ANGULAR POSITION TRANSDUCER AND ROTARY MOTION ENCODER HAVING ONCE-AROUND INDEX PULSE

[75] Inventors: Joannes N. M. deJong, Suffern; Meng H. Lean, Briarcliff Manor; Barry Wolf, Yorktown Heights; John J. Ricciardelli, Poughkepsie; Stuart A. Schweid, Henrietta; Robert M. Lofthus, Honeoye Falls, all of N.Y.

[73] Assignee: Xerox Corporation, Stamford, Conn.

[21] Appl. No.: 627,207

[22] Filed: Dec. 13, 1990

[51] Int. Cl.⁵ .......................................... G08C 19/46
[52] U.S. Cl. ........................ 340/870.31; 324/207.25; 318/647
[58] Field of Search ............... 340/870.31, 870.25, 340/870.37; 318/608, 730, 647, 606, 653, 661; 324/207.13, 207.22, 207.25, 233, 173, 174, 177; 33/1 PT; 336/79, 122, 200, 232

[56] References Cited

U.S. PATENT DOCUMENTS

| | | |
|---|---|---|
| 3,247,504 | 4/1966 | Emmerich . |
| 3,812,481 | 5/1974 | Stedtnitz . |
| 3,988,658 | 10/1976 | Meinke .................................. 318/647 |
| 4,223,300 | 9/1980 | Wiklund .......................... 340/870.31 |
| 4,270,077 | 5/1981 | Swartz ................................. 318/661 |
| 4,358,723 | 11/1982 | Scholl et al. . |
| 4,529,934 | 7/1985 | Heinrich ......................... 324/207.25 |
| 4,556,885 | 12/1985 | Kurosawa ..................... 340/870.31 |
| 4,638,249 | 1/1987 | Tanaka ............................ 340/870.37 |

OTHER PUBLICATIONS

INDUCTOSYN brochure from Farrand Controls; Xerox Disclosure Journal, vol. 10, No. 6, Nov. and Dec. 1985, p. 335.

Xerox Disclosure Journal, vol. 10, No. 6, Nov. and Dec. 1985, p. 337.

*Primary Examiner*—Donald J. Yusko
*Assistant Examiner*—Michael Krakovsky
*Attorney, Agent, or Firm*—Oliff & Berridge

[57] ABSTRACT

An inductive-type rotary encoder includes a stator having at least one conductive pattern on one side thereof, and a rotor having another conductive pattern on one side thereof which faces the at least one conductive pattern of the stator. The conductive patterns are inductively coupled to one another so as to generate an output signal indicative of the angular position of the rotor relative to the stator. In order to reduce the overall size and number of parts required, the circuitry for energizing the stator conductive pattern(s) and for generating the output signal can be provided on a printed circuit board, the opposite side of which contains the at least one stator conductive pattern. In order to reduce noise as well as to reduce the first harmonic error, lead lines for attaching the stator and rotor conductive patterns to the controlling circuitry and a return line which extends along substantially the entire length of the rotor or stator conductive patterns and attaches to one of the lead lines are provided and specially located relative to undulations of the conductive patterns. Additionally, the length of spokes which define undulations of the respective rotor and stator conductive patterns can be controlled to improve the performance of the rotary encoder. A rotary encoder including inductively coupled rotor and stator conductive patterns for generating a relative angular position (or rotary speed) of the rotor relative to the staator, as well as stator and rotor index pulse patterns inductively coupled for generating an index pulse once per revolution of the rotor relative to the stator is also provided.

35 Claims, 6 Drawing Sheets

INDUCTIVE TYPE INCREMENTAL ANGULAR POSITION TRANSDUCER AND ROTARY MOTION ENCODER HAVING ONCE-AROUND INDEX PULSE

BACKGROUND OF THE INVENTION

1. Field of the Invention

The present invention relates to position transducers and rotary motion encoders (resolvers) and more particularly to an inductive-type incremental angular position transducer having an improved stator and rotor winding geometry, compact packaging and/or a regular encoder output pulse train and a once-around index pulse for triggering other events in a machine.

2. Description of Related Art

A motion encoder is a device which produces an electronic signal whose frequency is proportional to the angular velocity of a member being measured (e.g., a shaft). Conventional encoders employ, for example, a very accurate optical disc. The disc can include a series of slots along its circumference or alternating transparent and opaque segments along its circumference which, when conveyed past a light beam, break the light beam and thereby create a pulse as the optical disc rotates. The frequency of the pulse varies as the speed of rotation of the disc varies. Alternatively, a single slot can be provided on the disc so that each output of the light pulse indicates 360° of rotation of the disc. However, optical discs are expensive to manufacture accurately. Additionally, the alignment specifications required to achieve desired accuracy increases costs significantly and thus prohibits application in many cases.

Inductive-type rotary motion encoders employ an induction principle to create pulses as a rotor is rotated. In contrast to optical encoders, which employ a single photodetector, inductive type encoders average the angular position along the perimeter of the rotary disc. This decreases the sensitivity to alignment parameters by an order of magnitude over optical encoders. Thus, a principle advantage of inductive type rotary encoders is their tolerance to mechanical alignment. The influence of miscentering and tilt are greatly reduced because the rotor sums the contributions from individual stator coils located around the perimeter thereof.

Since optical encoders have only one detector, no averaging (or summing) around the rotor perimeter can be performed. This is the primary pitfall of optical encoders. While the accuracy specification of an optical encoder may be 0.25 minutes of arc, even with extreme care, this accuracy can be achieved in practice only with great care in alignment. The best expected accuracy achievable with optical encoders is about 1–2 minutes of arc. This accuracy is about the same as that which is achievable using inductive-type rotary encoders. Therefore, the high degree of tolerance to misalignment achievable with inductive-type rotary encoders results in reduced manufacturing tolerances and significant cost savings.

Another advantage of inductive-type rotary encoders is that the phase of the rotor output signal varies almost linearly from $0-2\pi$ as the rotor rotates one line pair. This enables multiplication of the basic output counts (to be described below) per revolution by as much as 60 times. This can yield an encoder giving 14,000 counts per revolution.

The use of inductive-type rotary encoders is well known. See, for example, U.S. Pat. Nos. 3,247,504 to Emmerich; 3,812,481 to Stednitz; and 4,358,723 to Scholl et al, the disclosures of which are herein incorporated by reference.

U.S. Pat. No. 4,358,723 to Scholl et al discloses a method and apparatus for measuring rotation using a resolver which outputs a standard train of pulses and also includes a once-per-revolution optical indicator. See column 2, lines 47–51, column 4, lines 36–46, and column 7, lines 8–28. A basic rotor and stator layout is disclosed in FIG. 2, elements 14' and 14''. The output from the once-per-revolution optical indicator is used to compensate for manufacturing inaccuracies in the resolver.

U.S. Pat. No. 3,812,481 to Stednitz discloses a non-contacting electrical rotary position and rotation transducer which utilizes inductive coupling. The rotor includes at least one undulating or crenelated winding which is short-circuited. The rotor winding is energized by an energizing winding placed on a stator, by inductive coupling. The stator has at least one additional winding (sensing winding) thereon which matches the outline and configuration of the short-circuited rotor winding. Current flow is induced in the one or more stator sensing winding(s) by the rotor short-circuited winding(s). Thus, no contacts need to be provided for the winding(s) located on the rotor. Winding configurations for inducing one pulse per revolution when the rotor and sensing windings are in congruence are disclosed in FIGS. 3 and 4.

U.S. Pat. No. 3,247,504 to Emmerich discloses a digital resolver system which uses a stator and rotor pattern. Shaft position is determined by means of a digital resolver system.

Farrand Controls, a division of Farrand Industries, has marketed a precision linear and rotary position transducer under the tradename of Inductosyn.

OBJECTS AND SUMMARY OF THE INVENTION

An object of the present invention is to provide an induction type rotary resolver which is compact, having a reduced number of parts and a reduced size.

Another object of the present invention is to provide improved stator and rotor geometries for inductive-type rotary encoders which minimize the first harmonic error.

Another object of the present invention is to provide a rotary encoder which outputs a continuous pulse signal indicative of the relative angular position of the rotor to the stator (as well as the speed of rotation of the rotor) and an index pulse once per revolution of the rotor relative to the stator which uses inductive-type structure.

It is a further object of the present invention to provide rotor and stator patterns for inductive-type rotary encoders which increase the signal-to-noise ratio achievable therewith.

To achieve the foregoing and other objects, and to overcome the shortcomings discussed above, an inductive-type rotary encoder capable of generating an output signal indicative of the angular position of a rotor to a stator is disclosed. The rotary encoder includes a stator having at least one conductive pattern on one side thereof, a rotor having another conductive pattern on one side thereof which faces at least one conductive pattern of the stator and means for inductively coupling the conductive patterns to one another so as to generate an output signal indicative of the angular position of the rotor relative to the stator. In order to reduce the overall size and number of parts required, the circuitry for energizing the stator conductive pattern(s) and for generating the output signal from the rotor induced signal can be provided on a printed circuit board, the opposite side of which contains the at least one stator conductive pattern. In order to reduce noise as well as to reduce the first harmonic error, lead lines for attaching the stator and rotor conductive patterns to the controlling circuitry extend in opposite radial directions away from the rotor and stator patterns, respectively. Additionally, one of the lead lines from the rotor and/or stator conductive patterns can be attached to a return line which extends along substantially the entire length of the rotor or stator conductive patterns about their inner or outer peripheries. The provision of such return lines also serves to reduce noise and first harmonic error. Additionally, the length of spokes which define undulations of the respective rotor and stator conductive patterns can be controlled to improve the performance of the rotary encoder. A rotary encoder including inductively coupled rotor and stator conductive patterns for generating a relative angular position (or rotary speed) of the rotor relative to the stator as well as stator and rotor index patterns inductively coupled for generating an index pulse once per revolution of the rotor relative to the stator is also provided. Additionally, an index pulse pattern for the rotor and stator which maximizes the signal-to-noise ratio of the index pulse signal is provided.

BRIEF DESCRIPTION OF THE DRAWINGS

The invention will be described in detail with reference to the following drawings in which like references numerals refers to like elements and wherein.

DETAILED DESCRIPTION OF THE PREFERRED EMBODIMENTS

Figure 1:
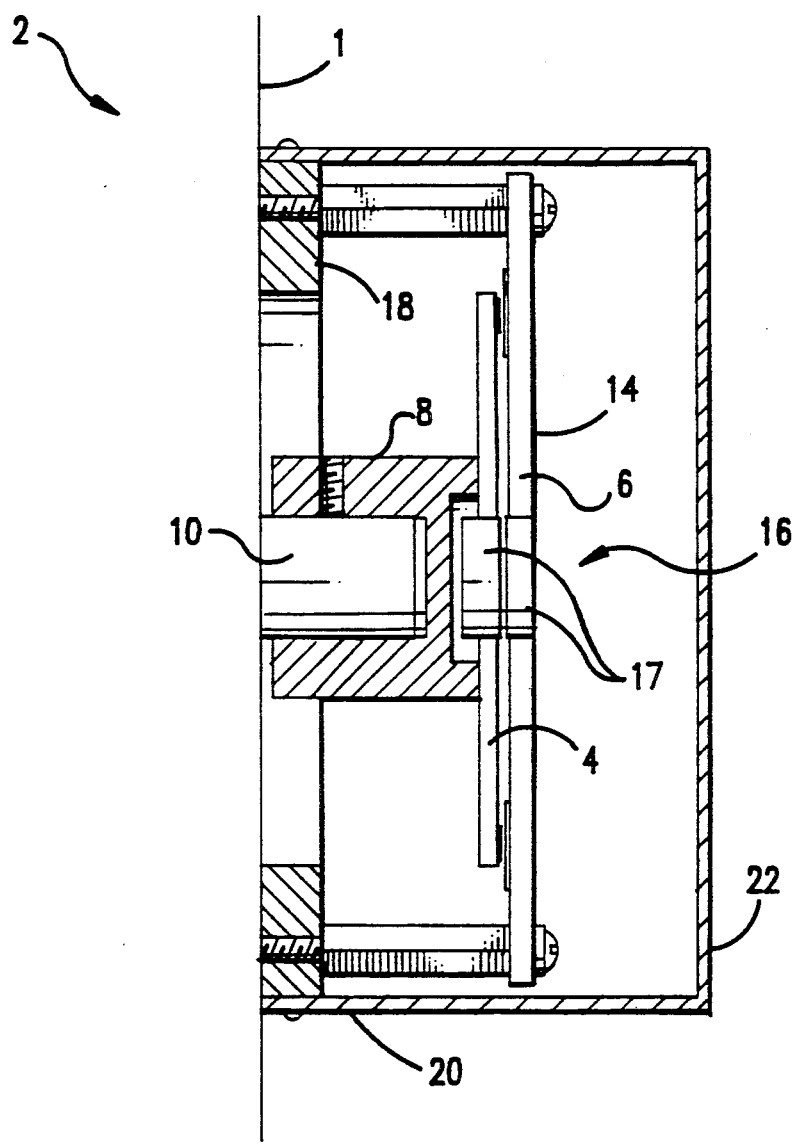
FIG. 1 is a side view, in partial cross-section, of an inductive-type rotary encoder according to one embodiment of the present invention.

FIG. 1 is a side, partially cross-sectional view of a rotary motion encoder 2 according to the present invention. The basic components of the rotary motion encoder 2 are a rotor or rotor plate 4, a stator or stator plate 6 and an electronic signal processing board which is preferably located on a side of the stator plate 6 opposite from the side thereof which faces rotor plate 4. The sides of rotor plate 4 and stator plate 6 which face each other contain conductive patterns which define a rotor and stator coil, respectively. Thus, with the present invention, preferably the stator coil and electronics which control the rotary encoder are contained on opposite sides of a single PC (Printed Circuit) board (i.e., stator plate 6). Preferred conductive patterns for forming the rotor and stator coils are described below. Rotor plate 4 and stator plate 6 are electrically coupled to one another via a rotary transformer 16 which is made up of ferrox cores 17 as is well known in the art. Rotor plate 4 is attached to a hub 8 which connects to a shaft 10, the rotation of which is to be monitored. Stator plate 6 is secured to a supporting surface 1 with, for example, a mounting ring 18 attached to stator plate 6 with, for example, bolts 20. The entire assembly can be provided with, for example, a cover 22 which is mounted to mounting ring 18.

Preferably, the electronics for controlling rotary encoder 2 and for monitoring the rotation of shaft 10 are provided on the back side 14 of stator plate 6. This configuration reduces parts and saves space, enabling the production of a more compact rotary motion encoder. Conductive patterns are deposited or etched on the appropriate surfaces of the rotor plate 4 and stator plate 6 by conventional, well known techniques to form the rotor and stator coils, as well as the control electronics or processing means for generating an output signal indicative of the angular position of the rotor to the stator. Double sided PC board technology is well known, and thus no further discussion is required for one of ordinary skill in the art to practice this aspect of the present invention.

Figure 2:
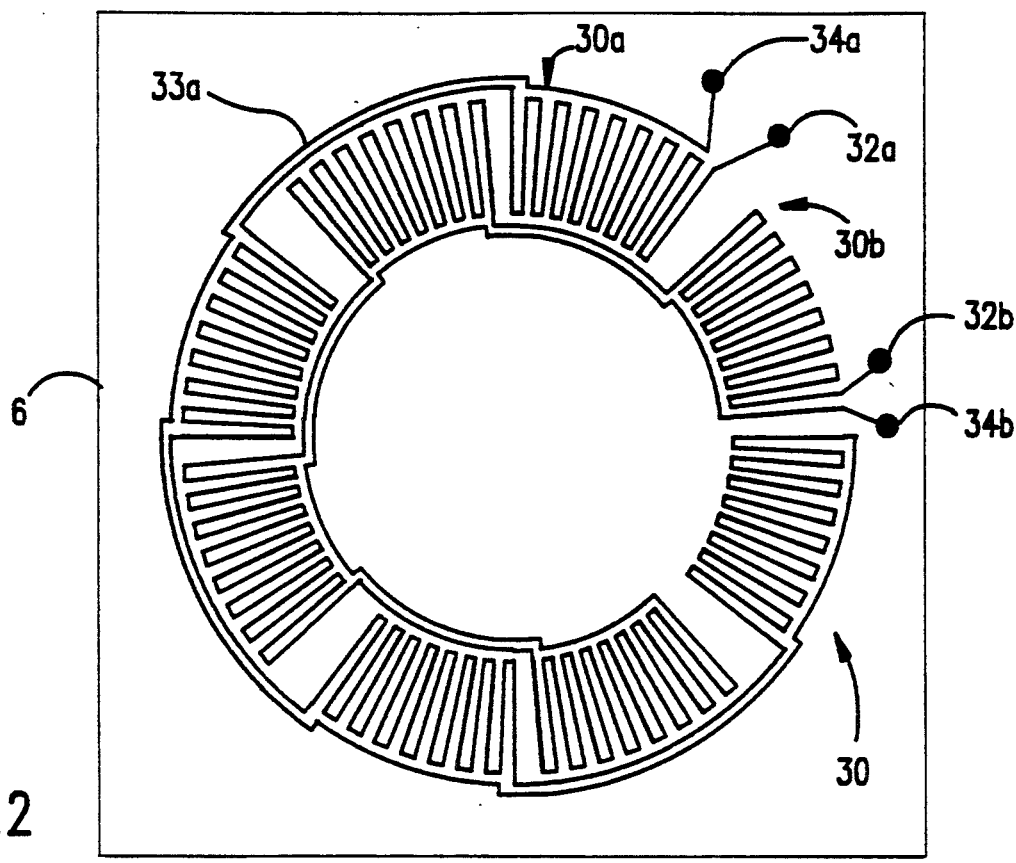
FIG. 2 is a plan view of first and second conductive patterns which are located on a stator plate according to one embodiment of the present invention.
Figure 3:
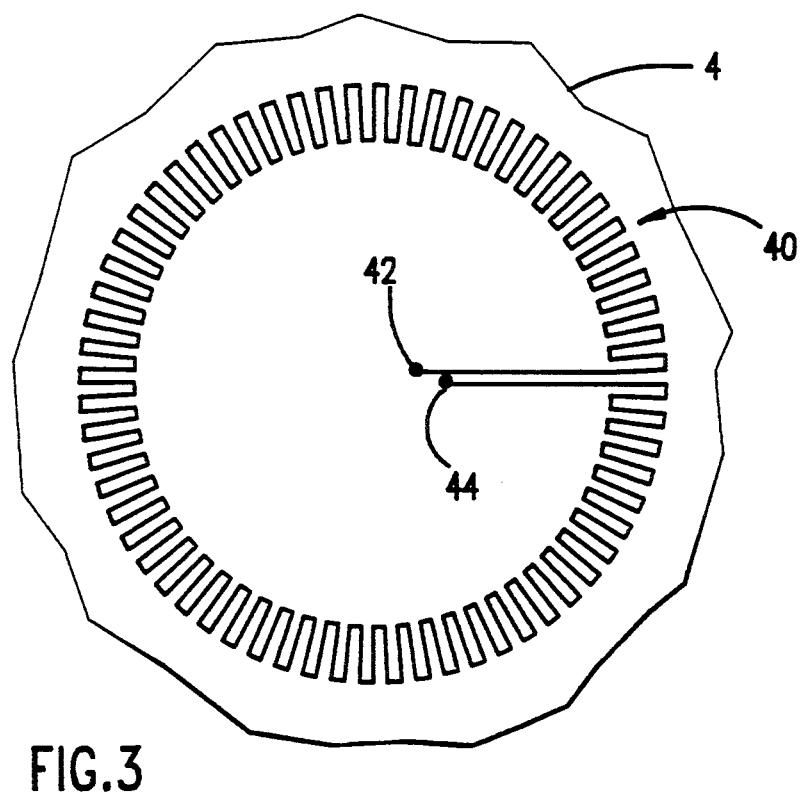
FIG. 3 is a plan view of a third conductive pattern located on a rotor plate for use with the stator conductive patterns of FIG. 2.

FIGS. 2 and 3 are plan views of conductive patterns 30, 40 which are located on the stator plate 6 and rotor plate 4, respectively. The conductive patterns (or coils 30, 40) illustrated in FIGS. 2 and 3 are used when it is desired to generate an output signal indicative of the relative angular position of the rotor to the stator from 0° to 360°. This output signal also can represent the rotational velocity of rotor coil 40 relative to stator coil 30.

The operating principles of the rotary encoder according to FIGS. 2 and 3 will now be described. Stator coil 30 on stator plate 6 includes two conductive patterns 30a and 30b, respectively. Each pattern is substantially annular in shape and includes an equal number of groups of equally spaced undulations. Each undulation includes, for example, two radially extending spokes attached to one another at one radial end thereof and attached to an adjacent undulation at an opposite radial end so that each spoke in each group of spokes is equally spaced from an adjacent spoke. Each of the groups of spokes from the first conductive pattern 30a is bounded on opposite sides thereof by a group of spokes from the other or second conductive pattern 30b.

Rotor plate 4 includes a single conductive pattern 40 which is substantially annular in shape and also includes a continuous series of equally spaced undulations which extend substantially 360°. Each undulation on rotor plate 4 also includes spokes attached to one another at one radial end thereof and attached to an adjacent undulation at an opposite radial end so that each spoke is equally spaced from an adjacent spoke.

The stator patterns 30a and 30b are spaced from one another on stator plate 6 in spatial quadrature. That is, stator patterns 30a and 30b are offset, with respect to each other, by ¼ of the length of a line pair (the length of a line pair is the distance between the spokes of an undulation). Each stator pattern 30a and 30b is driven with a high frequency square wave, which square waves have the same frequency and are in temporal quadrature (i.e., one wave is a sine wave, the other is a cosine wave). These square waves create a time varying magnetic field around both patterns. The magnetic field is sensed by the rotor conductive pattern 40, thereby inductively coupling the rotor conductive pattern 40 to both of the stator conductive patterns 30a, 30b. The degree of coupling of coil 30a to coil 40 and of coil 30b to coil 40 is related to the relative angular position of the stator and rotor patterns. When the coupling between coil 30a and 40 is maximum, the coupling between coil 30b and 40 is zero and vice versa. Thus, the sum of the coupling between coils 30a, 30b and coil 40 is approximately constant. The signal induced in rotor pattern 40 has a phase, relative to one of the stator coils 30a, 30b. The phase of the signal induced in rotor coil 40 increases linearly with angular position of rotor plate 4 to stator plate 6. The induced rotor signal is transmitted to the stationary electronic processing board located on the backside 14 of stator plate 6 through rotary transformer 16.

Figure 4:
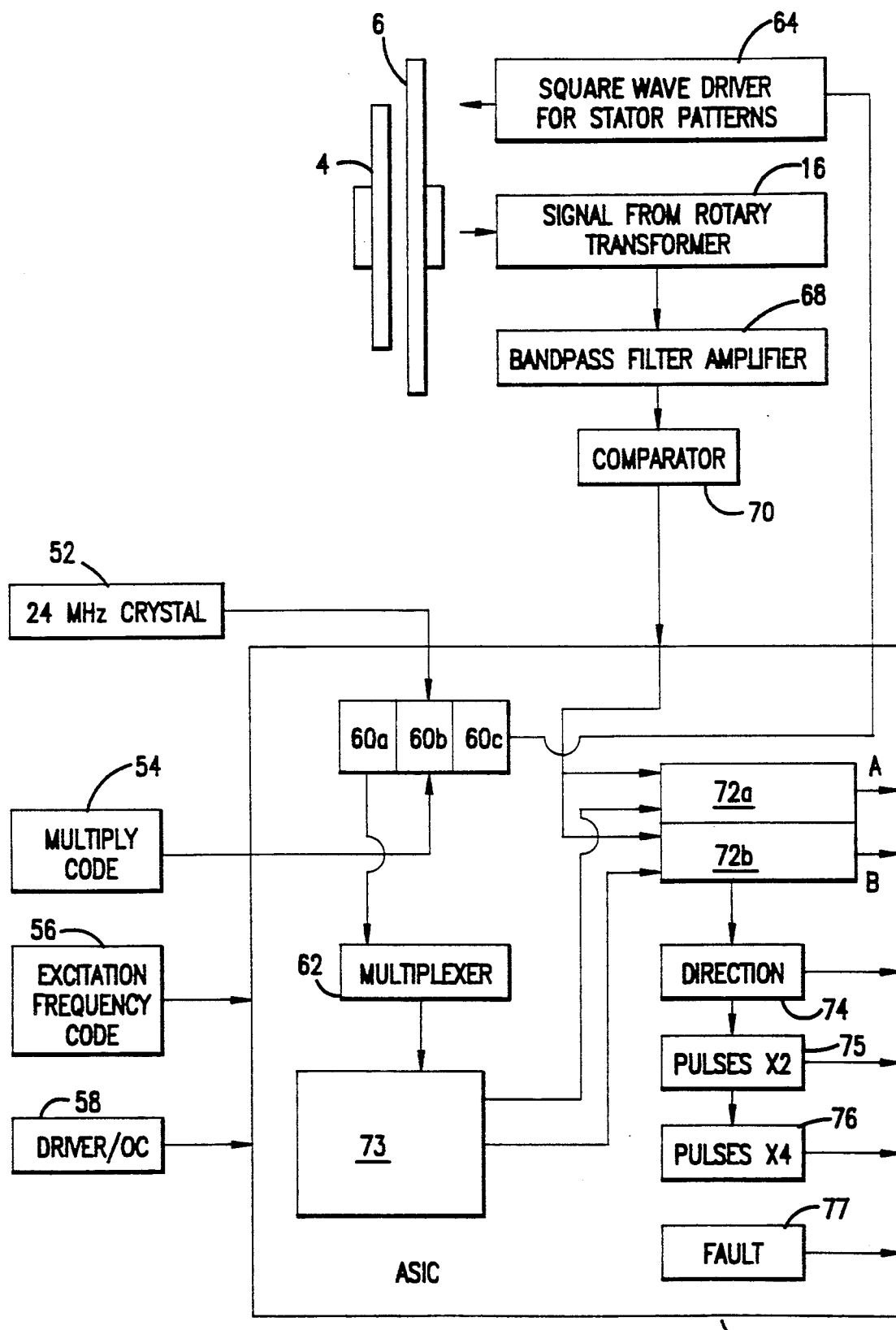
FIG. 4 is a block diagram illustrating electronic signal processing circuitry usable with the present invention.

The electronic signal processing circuitry 50 will now be described. A block diagram of the electronic signal processing circuitry 50 is shown in FIG. 4. This signal processing circuitry 50 supplies signal(s) to the stator conductive patterns 30a, 30b, receives an induced signal from rotor conductive pattern 40 and generates an output signal indicative of the angular position of the rotor plate 4 to stator plate 6. Thus, circuitry 50 is one means for inductively coupling the stator and rotor patterns and for generating an output signal indicative of the angular position of rotor plate 4 to stator plate 6. The means for inductively coupling includes processing means for receiving at least an induced signal from the rotor conductive pattern 40 and for generating the output signal.

By using an Application Specific Integrated Circuit (ASIC), the electronic processing circuitry 50 can be located on surface 14 of state plate 6 opposite from the side of stator plate 6 which contains the conductive patterns 30a, 30b. Two quadrature excitation signals are created by dividing down the 24 MHz crystal clock 52 with a divisor of, for example, either thirty or sixty, as determined by the values of two excitation frequency select inputs 56 acting on multiplexer 60b, whose output is then processed by quad generator 60c to create two signals. These two signals, in temporal quadrature, with a frequency equal to one quarter the frequency of the input to quad generator, 60c, are delivered to stator patterns 30a and 30b by square wave current driver 64. In this particular application, the choice of excitation frequency is limited to 100 KHz or 200 Kz, however, these values can be changed without any loss of generality by anyone skilled in the art. The magnetic field created by stator conductive patterns 30a and 30b is detected by pattern 40 on rotor plate 4 via an induced voltage across the terminals 42 and 44 of the rotor coil. This signal is transmitted through rotary transformer 16 to bandpass filter amplifier 68.

The output of the bandpass amplifier is an analog voltage signal which is sinusoidal in nature and whose frequency is the same as the excitation frequency. However, the bandpass amplifier output signal will be phase shifted relative to the excitation frequency by an amount that is proportional to the relative angular displacement of the rotor to the stator. The proportionality constant is related to the number of line pairs per revolution of the rotor plate and the stator plate. The output of the bandpass filter is then sent through comparator 70 to create a digital square wave compatible with the circuitry of ASIC 50. The digitized signal is then sent as inputs to phase comparators 72a and 72b.

The other input for both phase comparators 72a and 72b comes from the quad generator 73, which creates two signals in temporal quadrature. One of the two outputs of quad generator 73 becomes an input to phase comparator 72a while the other becomes an input to phase comparator 72b. The output frequency of quad generator 73 is one quarter the frequency of its input, which is provided by the output of multiplexer 62. The inputs to multiplexer 62 are comprised of 12 signals which are generated in the divide-by-N divider circuitry 60a, by dividing down the 24 MHz crystal 52. The twelve divisors of divider circuitry 60a are themselves divisors of sixty, i.e., 1, 2, 3, 4, 5, 6, 10, 12, 15, 20, 30 and 60, with the result that their frequency values are integer multiples of the stator excitation frequency. The value of sixty for the largest clock divisor was chosen for this application—it is important to realize, however, that this value is not essential to the operation of the device and can be easily changed by anyone skilled in the art. Note that the signals generated by the divisors thirty and sixty, which are 24 MHz/30 and 24 MHz/60, respectively, are additionally sent to multiplexer 60b to eventually create the quadrature driver signals sent to the square wave current driver for stator patterns 30a and 30b.

Both phase comparators 72a and 72b yield an integer number of pulses, N, for each line pair unit of angular rotation of the rotor relative to the stator. The value of N is determined by the inputs of the four bit multiply select 54 to multiplexer 62, and, in the present example, is limited to divisors of the number 60. The outputs of phase comparators 72a and 72b, further referred to as channel A and channel B, are in temporal quadrature as a result of the temporal quadrature of the constant frequency inputs to phase comparators 72a and 72b provided by quad generator 73. The details of comparison are well known and described in, for example, Xerox Disclosure Journal disclosures entitled "Inductosyn Transducer Circuitry", Vol. 10, No. 6, pages 335 and 337 (November/December 1985), the disclosure of which is herein incorporated by reference. The outputs channel A and channel B are outputs of ASIC 50 and are intended to be analogous to those generated by commercially available incremental motion encoders. Additionally, data form conversion 74, whose inputs are channel A and channel B, creates a direction line and two single channel outputs 75, 76 with resolution of two and four times that of channel A.

A multiplication up to, for example, sixty is possible. Thus, from a 200 line pair per revolution rotor/stator pattern, 12,000 encoder pulses per revolution can be obtained. It is advantageous to control the number of pulses output per revolution of rotary encoder 2 depending on the particular application of the rotary encoder. For example, when a relatively slow rotation movement is measured, the number of pulses per rotation of the rotor should be increased, whereas a lesser number of pulses per rotation are usually necessary for higher rotational speeds. There is an upper limit of the frequency attainable for both channel A and channel B, and this value is equal to one quarter of the excitation frequency, where the excitation frequency is the frequency of the output of quad generator 60c. For example, if the excitation frequency select 56 is chosen such that the divide-by-60 option is active, the excitation frequency will be 24 MHz/(60*4), or 100 KHz, and therefore the maximum frequency of the output of both channel A and channel B is limited to 25 KHz.

Additional gate logic discussed here provides product enhancement but is not essential to the basic operation of the encoder. These include the fault circuitry detection 77 which performs several self diagnostic tests on power up and can be used to test the proper operation of the encoding device. Another feature of the device is that the driver/open-drain select 58 gives the device the flexibility of operating with outputs that are either driven high outputs or open drain outputs.

The present inventors have discovered a number of features which improve the accuracy and thus the usefulness of inductive type rotary motion encoders. For example, by constructing the stator conductive patterns 30a and 30b and the rotor conductive pattern 40 so that the spokes of the rotor conductive pattern 40 have a length which is no more than one half the length of the rotor conductive patterns, the first harmonic error is minimized. The first harmonic error is a resolver error (as compared to a perfect resolver), the spatial frequency of which equals the number of pulses per revolution. There is some theoretical first harmonic error, which originates from the geometry of the magnetic field. However, a large part of the first harmonic error appears when parasitic inductive coupling exist. Parasitic inductive coupling is defined as direct inductive coupling between output and input signals that does not originate from the annular patterns. The present layout of the rotor reduces parasitic coupling and thus reduces the first harmonic error.

Additionally, interference or cross-talk between stator conductive patterns 30a, 30b and rotor conductive pattern 40 is reduced by the particular placement of lead lines 32a, 32b, 34a, 34b for attaching stator conductive patterns 30a and 30b to the control electronics relative to lead lines 42, 44 which attach rotor conductive pattern 40 to the control electronics. In particular, the stator lead lines 32a, 32b, 34a, 34b all extend in one of the directions of radially outwardly and radially inwardly of their corresponding conductive patterns 30a, 30b, while the lead lines 42, 44 of the rotor conductive pattern 40 extend in a direction opposite from the stator lead lines 32a, 32b, 34a, 34b. Preferably, the rotor lead lines 42, 44 extend radially inwardly for easy attachment to the corresponding ferrox core 17 of the rotary transformer 16. Consequently the stator lead lines 32a, 32b, 34a, 34b extend radially outwardly from the annular stator conductive patterns 30a, 30b.

In order to further reduce interference between each of the stator conductive patterns 30a, 30b, return lines 33a and 33b are provided on conductive patterns 30a, 30b, respectively. Whereas one of the lead lines for each conductive pattern (for example, lead lines 32a, 32b) is attached directly to an undulation of its corresponding conductive pattern, the other lead line (for example, lead lines 34a, 34b) is attached to a return line (33a, 33b) which extends back along the length of its corresponding conductive pattern (30a, 30b) for attachment to an end of the conductive pattern opposite from the end to which the one lead line (32a, 32b) is attached. Additionally, the return line of each of the conductive patterns 30a, 30b is located on an opposite one of inner and outer peripheries of each annular stator pattern. For example, return line 33a extends around an outer periphery of stator conductive pattern 30a while return line 33b extends around an inner periphery of stator conductive pattern 30b. This configuration, including the return lines, minimizes unproductive areas of coils 30a and 30b.

In some applications, it is desirable to have a once-around index pulse available to trigger other events in a machine. When using an inductive type incremental angular position rotary encoder as described above with reference to FIGS. 2 and 3, it is convenient to have this index pulse generated by inductive coupling also. A correlation-type pattern is now described which can be used to output an index pulse once per revolution of a rotor relative to a stator. This correlation-type pattern can be used individually or in combination with an inductive type incremental angular position rotary motion encoder of the type described above. When used in combination with an incremental angular position rotary motion encoder, the index pulse pattern can be easily integrated with the incremental angular position conductive pattern on one substrate (i.e., the stator plate can include a conductive pattern which can be inductively coupled with a rotor conductive pattern for outputting a continuous train of pulses as well as a stator index pulse pattern which is inductively coupled to a rotor index pulse pattern for the output of an index pulse once per revolution of the rotor relative to the stator). Similarly, the rotor can include a conductive pattern for being inductively coupled to the stator conductive pattern and an index pulse pattern for being inductively coupled to the stator index pulse pattern. The control electronics for controlling the index pulse patterns can also be located on backside 14 of stator plate 6.

Figure 5:
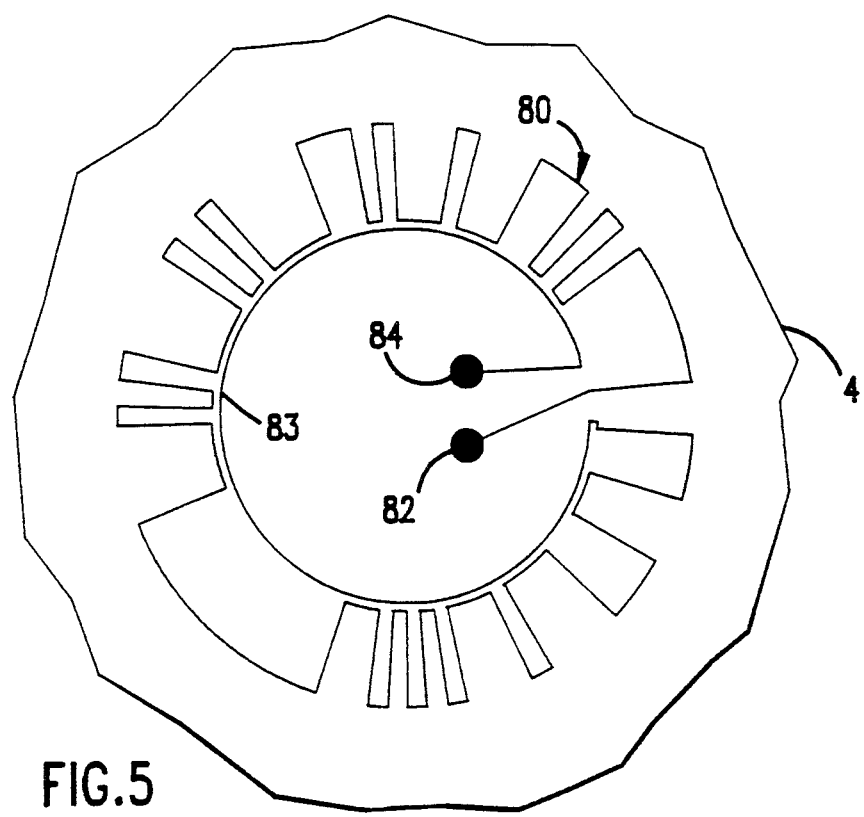
FIG. 5 is a plan view of an index pulse pattern which can be located on, for example, a rotor plate.
Figure 6:
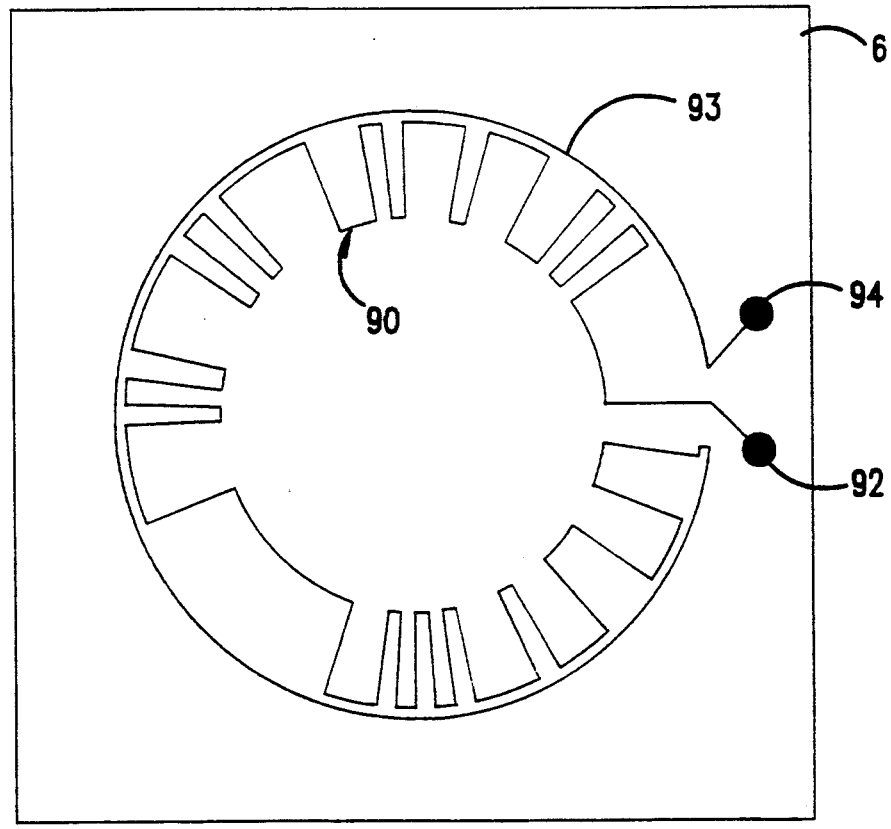
FIG. 6 is a plan view of an index pulse pattern which can be located on, for example, a stator plate, and which is usable with the index pulse pattern of FIG. 5.

Typical index pulse patterns for the rotor and stator, respectively, are shown in FIGS. 5 and 6. As can be seen from FIGS. 5 and 6, both the rotor and stator have substantially the same patterns formed thereon. Each of these patterns are preferably asymmetrical about a line drawn through a center point thereof so that the patterns will be in congruence, or conjunction, once per revolution, at which point a sharp output signal will be generated by the rotor index pulse pattern.

The type of signal supplied to stator index pulse pattern 90 is of sinusoidal or square wave of very high frequency (e.g., 10 MHz). The induced signal in rotor index pulse pattern 80 has the same frequency as the signal supplied to stator index pulse pattern 90. However, the amplitude of the induced signal varies with angular position and reaches a maximum amplitude once per revolution when the patterns 80 and 90 are in congruence.

To minimize background noise, careful attention was paid to the index pulse pattern coil layout. The rotor lead lines 82, 84 extend in an opposite radial direction from the stator lead lines 92, 94. Additionally, the rotor return line 83 is located along an opposite radial peripheral surface of the rotor and stator index pulse patterns 80, 90, respectively, from the stator return line 93. The locations of the lead lines and return lines are chosen on opposite sides of the active overlap area of the rotor and stator index pulse patterns so as to minimize parasitic coupling between these lines. Thus, active coupling areas between the rotor index pulse pattern 80 and the stator index pulse pattern 90 are formed only over tooth sections (i.e., the undulations) and exclude the return lines (also referred to as annular closures) and lead lines on both sides. Although it is preferred to locate the rotor lead lines 82, 84 and the rotor return line 83 on the inner periphery of index pulse pattern 80 to permit easy attachment of lead lines 82, 84 to the rotary transformer 16 and, consequently to locate the stator lead lines 92, 94 and return line 93 on the outer peripheral surface of the stator index pulse pattern 90, the opposite arrangement can also be utilized.

When providing the specific arrangement of undulations for the rotor and stator index pulse patterns 80, 90, respectively, it is desirable to minimize the output signal when the patterns are not in conjunction so that the resulting output signal when the patterns are in conjunction is a sharp index pulse for each rotor revolution. In the following description, the undesirable signal (i.e., the output signal when the rotor and stator patterns are not in conjunction) will be called "noise".

For purposes of analysis, the pattern (rotor or stator since the arrangement of undulations on the rotor and stator pattern are the same) is divided into N equal circumferential segments. This corresponds to N incremental positions of the rotor. Lines (current conductors or spokes), that point inward and outward, separate one or more segments of the index pulse pattern. The objective is to place these lines (or spokes) so as to minimize signal-to-noise ratio.

At each incremental position of the N positions, one can assign "p(i) = +1" to a radial outward line (spoke), "p(i) = 0" to the absence of a radial line (spoke) and "p(i) = −1" to a radial inward line (spoke). (Note: the terms "outward" and "inward" refer to directions of current flow). Previously, the signal at each position i (i=1...N) was assumed to be proportional to the number of stator/rotor lines pointing in the same direction. i.e.

$$S(i) = k \left| \sum_{j=1}^{N} p(j)p(j+i) \right| \text{ where } p(j) = p(j+N) \quad (1)$$

The variable k is a proportionality constant converting to volts. Letting i=1 denote the position when the patterns are in conjunction (output of index pulse) and i=J denote the position of maximum "noise", that is, $$S(J) = \text{Max } \{S(2), S(3), \ldots S(N)\} \quad (2)$$

a signal to noise ratio (SNR) can be defined as:

$$SNR = \frac{S(1)}{S(J)} \quad (3)$$

(Note: In the absence of any background noise it is possible to get a large signal-to-noise ratio for small N. This is not practical, however, since the signal S(1) is small in this case and any small amount of background noise would drastically reduce SNR). For a reasonable value of N (e.g. 50), a SNR≈6 was obtainable previously.

According to the present invention, the above analysis was reconsidered. In this analysis a different, less approximate, measure of the signal was used. The signal and noise calculations were based on area rather than line conjunction. That is, the area between spokes was used instead of the number of spokes (pointing inward and/or outward) to determine the amount of "noise". In this new analysis, the normal field between each adjacent conductor (spoke) is assumed to be essentially uniform so that the induced signal will be a function of the overlap area (between the rotor and stator index patterns). The above assumption (of field uniformity) increases in accuracy as the maximum distance between adjacent conductors (spokes) decreases. Thus, one can select a maximum conductor spacing based upon the degree of accuracy which is required. For the stator, one can, for each i, assign "p(i) = +1" for areas in which the current is clockwise (field into the paper) and "p(i) = −1" for areas in which the current is counter clockwise (field out of the paper). However, for the rotor one must assign "p(i) = +1" (CW) and "p(i) = 0" (CCW). This signifies unity inductive pick-up inside the rotor coil and no pick-up outside the coil. With this redefinition, equations (1), (2) and (3) can be used to calculate signal-to-noise ratio. A substitution type Monte Carlo simulation program to randomly assign a "1" or "−1" at each location i (i=1−N) was written in Fortran. That is, this program used a random method for selecting the locations of the undulations. Signal-to-noise ratio was computed for each random pattern and the pattern having the highest signal-to-noise ratio was saved. Any number of programs can be used to randomly select undulation locations, which programs can be determined by one of ordinary skill in the art. The use of the above-described method for determining signal-to-noise ratio (i.e., using areas instead of lines) permits the random pattern having the highest signal-to-noise ratio to be selected.

By using the above formulas (1), (2) and (3), as well as areas between adjacent spokes for values of p(i) to maximize the signal-to-noise ratio SNR, an index pulse pattern having the shape shown in FIGS. 5 and 6 was derived. These index pulse patterns 80, 90 for the rotor and stator, respectively, are essentially the same shape except for the locations of the lead lines 82, 84, 92, 94 and the return lines 83; 93 as described above. The signal output from rotor index pulse pattern will be a sharp pulse once per revolution of the rotor relative to the stator. In the absence of background noise a signal-to-noise ratio of 31/0, 63/2, 107/4, 139/6 and 219/10 can be obtained with N=31, 63, 107, 139 and 219, respectively for the index pulse patterns of FIGS. 5 and 6.

Figure 7:
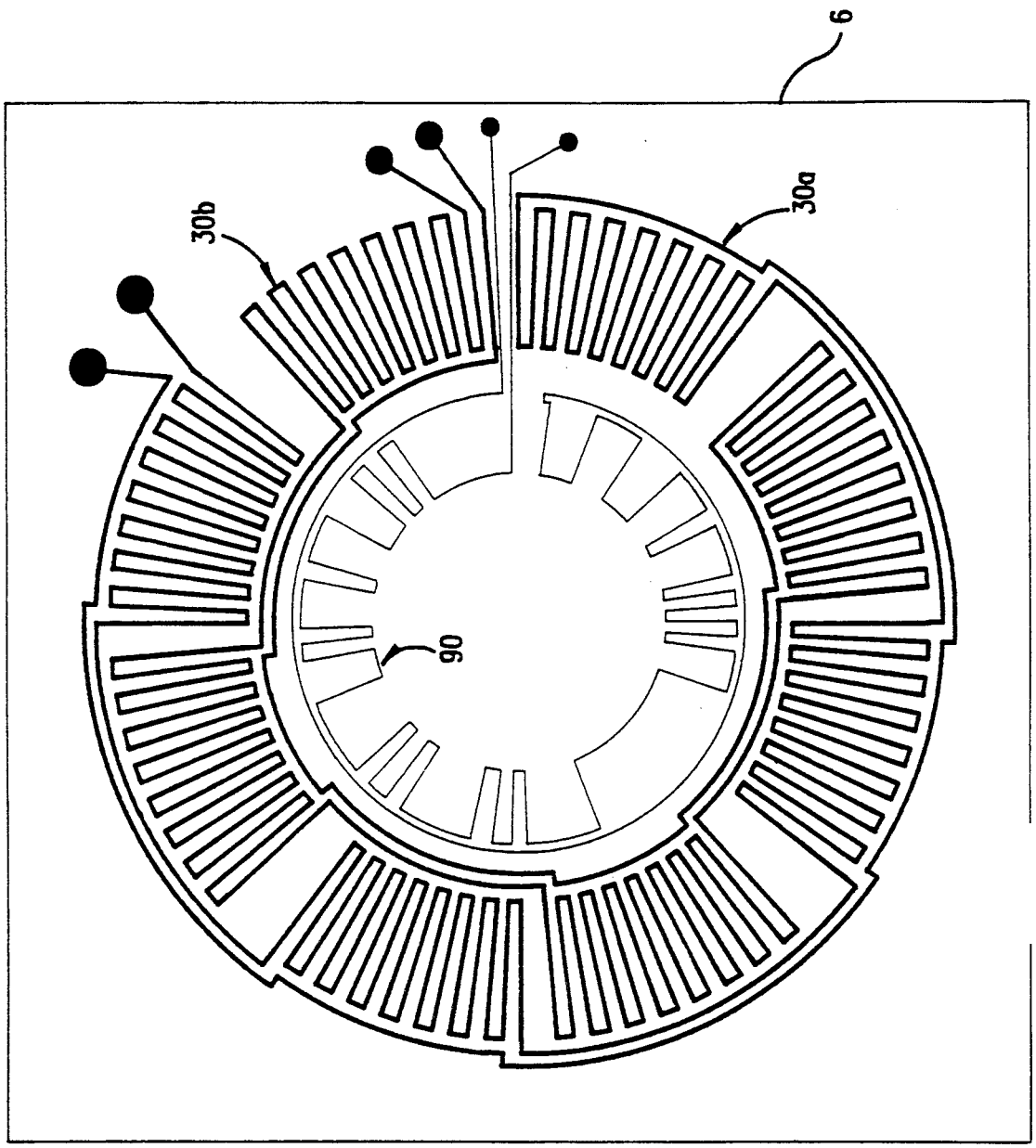
FIG. 7 is a plan view of a stator plate according to the present invention which includes first and second pulse-train generating conductive patterns as well as a first index pulse pattern.
Figure 8:
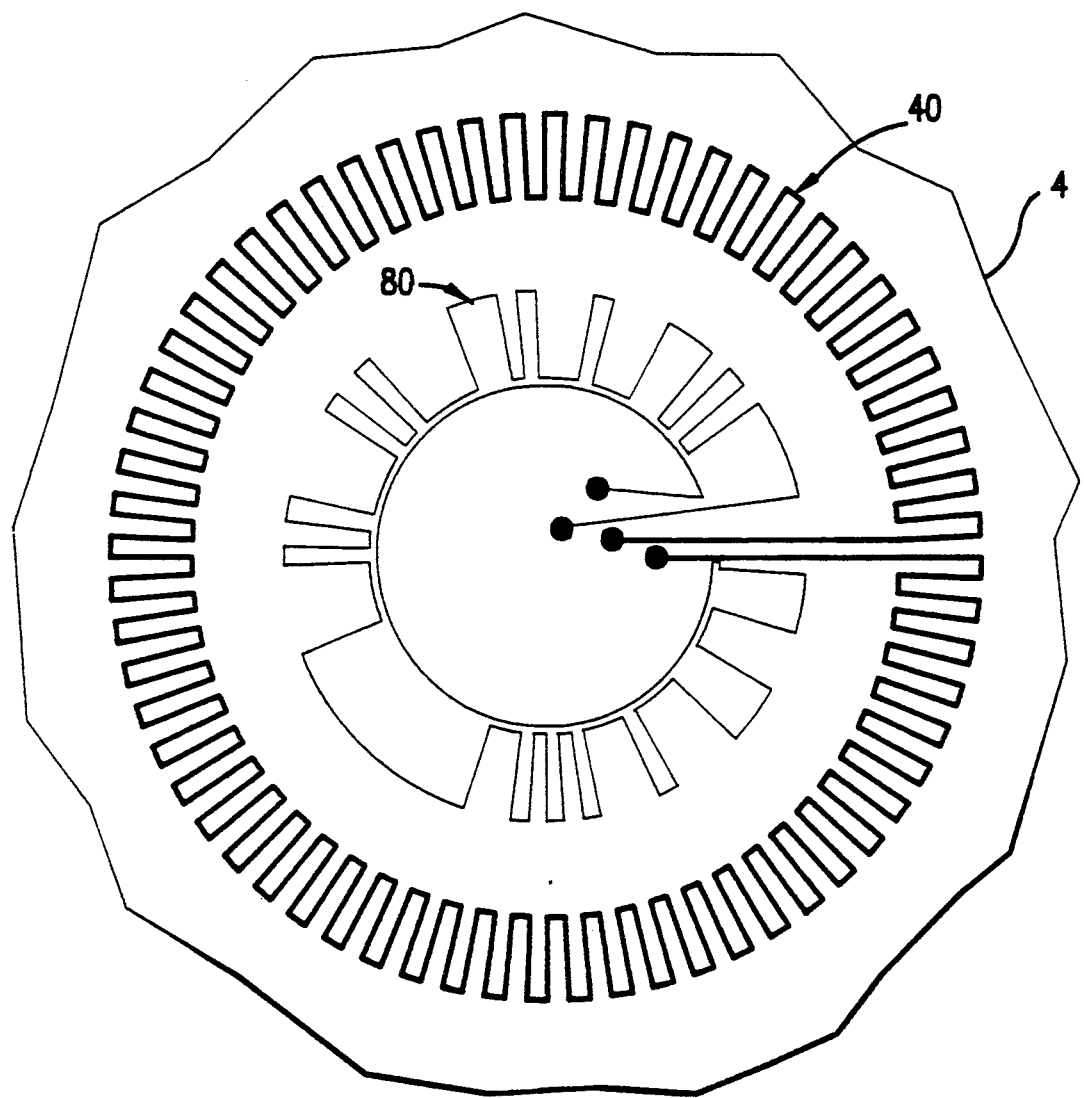
FIG. 8 is a plan view of a rotor plate including a third pulse-train generating conductive pattern and a second index pulse pattern usable with the stator plate of FIG. 7.

As shown in FIGS. 7 and 8, the index pulse patterns 90 and 80 can be located on the stator plate 6 and rotor plate 4, respectively, spaced radially within the corresponding conductive patterns 30a, 30b and 40 to provide a combined rotary motion encoder which outputs an index pulse signal once per revolution of the rotor plate 4 to the stator plate 6 as well as a continuous train of pulses indicating the angular location of the rotor plate 4 relative to the stator plate 6. Such a combined rotary encoder is useful when it is necessary to monitor and control the rotational speed of a member as well as to monitor the once-per-revolution location of the member so as to trigger other events in a machine. For example, in an image recording machine which records images in multiple colors, it is desirable to monitor a once-per-revolution location of a photoreceptor drum so that the respective color images which are used to produce a single multi-color image are properly aligned with one another on the sheet containing the final output image.

While the present invention is described with reference to a particular embodiment, this particular embodiment is intended to be illustrative, not limiting. Various modifications may be made without departing from the spirit and scope of the invention as defined in the appended claims.

What is claimed is:

1. A rotary encoder comprising:
   a stator having at least one conductive pattern on one side thereof;
   a rotor having another conductive pattern on one side thereof which faces said at least one conductive pattern of said stator; and
   means for inductively coupling said another conductive pattern on said rotor to said at least one conductive pattern on said stator so as to generate an output signal indicative of the angular position of said rotor to said stator;
   wherein said means for inductively coupling includes processing means for receiving at least an induced signal from said another conductive pattern on said rotor and generating said output signal, at least said processing means being located on a side of said stator opposite from said at least one conductive pattern.

2. The rotary encoder according to claim 1, wherein said output signal is an index pulse generated by said processing means, said index pulse being generated once per revolution of said rotor relative to said stator when the inductive coupling is maximum.

3. The rotary encoder according to claim 2, wherein said at least one conductive pattern and said another conductive pattern are both annular in shape and asymmetrical about a line drawn through each of their respective centers regardless of the radial position of the line.

4. The rotary encoder according to claim 1, wherein said stator includes first and second conductive patterns on said one side, and said output signal is indicative of the relative angular position of said rotor to said stator from 0° to 360°.

5. The rotary encoder according to claim 4, wherein said processing means also supplies first and second driving signals to said first and second conductor patterns, respectively.

6. The rotary encoder according to claim 5, wherein said first and second driving signals supplied by said processing means are square waves in temporal quadrature, said first and second conductive patterns being in spatial quadrature, said induced signal is a sine wave and said processing means further includes means for comparing a phase of said induced signal to a phase of one of said first and second driving signals and for generating said output signal based on said comparison.

7. The rotary encoder according to claim 1, wherein said at least one pattern and said another pattern are annular in shape and each include two lead lines for attachment to circuitry of said means for inductively coupling, all of said lead lines on said stator extending in one of the directions of radially outwardly and radially inwardly of said at least one conductive pattern, while all of said lead lines on said rotor extend in a direction opposite from the lead lines on said stator.

8. The rotary encoder according to claim 7, wherein all of said lead lines on said stator extend radially outwardly of said at least one conductive pattern, while all of said lead lines on said rotor extend radially inwardly of said another conductive pattern.

9. The rotary encoder according to claim 4, wherein each of said first and second conductive patterns is annular in shape and includes an equal number of groups of equally spaced undulations, each undulation including two radially extending spokes attached to one another at one radial end thereof and attached to an adjacent undulation at an opposite radial end so that each spoke in each group of spokes is equally spaced from an adjacent spoke, each of the groups of spokes of said first conductive pattern being bounded on opposite sides thereof by a group of spokes from said second conductive pattern, and wherein said another conductive pattern on said rotor is annular in shape and includes a continuous series of equally spaced undulations which extends substantially 360°, each undulation including two radially extending spokes attached to one another at one radial end thereof and attached to an adjacent undulation at an opposite radial end so that each spoke is equally spaced from an adjacent spoke.

10. The rotary encoder according to claim 9, wherein a length of the spokes in said another conductive pattern are no more than one half a length of the spokes in said first and second conductive patterns.

11. The rotary encoder according to claim 9, wherein each of said first and second conductive patterns:
   i) extends less than 360° around said stator and has a length, measured along a circumference of its annular shape, with two ends;
   ii) includes a first lead attached at one of said two ends; and
   iii) includes a return line, attached at the other of said two ends, and extending back along said length to an area adjacent said one end, said return line terminating at a second lead.

12. The rotary encoder according to claim 11, wherein the return line of said first conductive pattern extends around an outer periphery thereof, while the return line of said second conductive pattern extends around an inner periphery thereof.

13. The rotary encoder according to claim 2, wherein each of said at least one conductive pattern and said another conductive pattern:
   i) is annular in shape, extends less than 360° around said stator and rotor, respectively, and has a length, measured along a circumference of its annular shape, with two ends; and
   ii) includes a first lead, attached at one end thereof, and a return line attached at an opposite end thereof which extends back along said length to an area adjacent said first lead, terminating at a second lead; wherein the return line on said rotor extends around one of an inner and outer periphery of said another conductive pattern, while the return line on said stator extends around the other of the inner and outer periphery of said at least one conductive pattern.

14. The rotary encoder according to claim 13, wherein the return line on said rotor extends around the inner periphery of said another conductive pattern, while the return line on said stator extends around an outer periphery of said at least one conductive pattern.

15. The rotary encoder according to claim 13, wherein the first and second leads of each respective conductive pattern extend in a radial direction away from their corresponding conductive pattern from a side of their corresponding conductive pattern which contains the return line.

16. The rotary encoder according to claim 4, wherein: said another conductive pattern is a third conductive pattern, and further comprising:

a first index pulse pattern located on said stator and radially spaced from said first and second conductive patterns;

a second index pulse pattern located on said rotor, radially spaced from said third conductive pattern and facing said first index pulse pattern; and means for inductively coupling said first and second index pulse patterns to generate an index pulse once per revolution of said rotor relative to said stator when inductive coupling between said first and second index pulse patterns is maximum.

17. The rotary encoder according to claim 2, wherein said at least one conductive pattern on said stator is a first index pulse pattern, and said another conductive pattern on said rotor is a second index pulse pattern, said first and second index pulse patterns being substantially similarly shaped and having a plurality of undulations arranged in an annular shape, each undulation having two radially extending spokes attached to each other at one radial end thereof and attached to an adjacent undulation at an opposite radial end thereof to define areas between each spoke, the locations of said spokes being determined so as to maximize a signal-to-noise ratio, SNR, according to the following formulas:

$$SNR = \frac{S(1)}{S(J)},$$

where S(1) is the output signal when the rotor and stator patterns are in conjunction, and S(J) is a highest value of the output signal when the rotor and stator patterns are not in conjunction; the value of S(i) being determined according to the following formula:

$$S(i) = k \left| \sum_{j=1}^{N} p(j)p(j+i) \right| \text{ where } p(j) = p(j+N)$$

wherein, for the stator, $p(i)=1$ for areas in which the current is clockwise and $p(i)=-1$ for areas in which the current is counterclockwise, and for the rotor, $p(i)=1$ for areas in which the current is clockwise and $p(i)=0$ for areas in which the current is counterclockwise, k is a proportionality constant, and N is a number of equally sized circumferential segments of each index pulse pattern.

18. The rotary encoder according to claim 1, wherein said stator includes a printed circuit board having first and second oppositely facing surfaces with said at least one conductive pattern located on said first surface, and at least said processing means located on said second surface.

19. A rotary encoder comprising:

a stator having at least one conductive pattern on one side thereof;

a rotor having another conductive pattern on one side thereof which faces said at least one conductive pattern of said stator; and means for inductively coupling said another conductive pattern on said rotor to said at least one conductive pattern on said stator so as to generate an output signal indicative of the angular position of said rotor to said stator;

wherein said at least one pattern and said another pattern are annular in shape and each include two lead lines for attachment to circuitry of said means for inductively coupling, all of said lead lines on said stator extending in one of the directions of radially outwardly and radially inwardly of said at least one conductive pattern, while all of said lead lines on said rotor extend in a direction opposite from the lead lines on said stator.

20. The rotary encoder according to claim 19, wherein all of said lead lines on said stator extend radially outwardly of said at least one conductive pattern, while all of said lead lines on said rotor extend radially inwardly of said another conductive pattern.

21. The rotary encoder according to claim 19, wherein said output signal generated by said means for inductively coupling is an index pulse, said index pulse being generated once per revolution of said rotor relative to said stator when inductive coupling is maximum.

22. The rotary encoder according to claim 21, wherein said at least one conductive pattern and said another conductive pattern are both annular in shape and asymmetrical about a line drawn through each of their respective centers regardless of the radial position of the line.

23. The rotary encoder according to claim 19, wherein said stator includes first and second conductive patterns on said one side, each having two lead lines, all of said lead lines of said first and second conductive patterns extending in the same one of said radially outward and radially inward directions, and said output signal is indicative of the relative angular position of said rotor to said stator from 0° to 360°.

24. The rotary encoder according to claim 23, wherein each of said first and second conductive patterns is annular in shape and includes an equal number of groups of equally spaced undulations, each undulation including two radially extending spokes attached to one another at one radial end thereof and attached to an adjacent undulation at an opposite radial end so that each spoke in each group of spokes is equally spaced from an adjacent spoke, each of the groups of spokes of said first conductive pattern being bounded on opposite sides thereof by a group of spokes from said second conductive pattern, and wherein said another conductive pattern on said rotor is annular in shape and includes a continuous series of equally spaced undulations which extends substantially 360°, each undulation including two radially extending spokes attached to one another at one radial end thereof and attached to an adjacent undulation at an opposite radial end so that each spoke is equally spaced from an adjacent spoke.

25. The rotary encoder according to claim 24, wherein each of said first and second conductor patterns:

i) extends less than 360° around said stator and has a length, measured along a circumference of its annular shape, with two ends;

ii) includes a first lead attached at one of said two ends; and iii) includes a return line, attached at the other of said two ends, and extending back along said length to an area adjacent said one end, said return line terminating at a second lead.

26. The rotary encoder according to claim 25, wherein the return line of said first conductive pattern extends around an outer periphery thereof, while the return line of said second conductive pattern extends around an inner periphery thereof.

27. The rotary encoder according to claim 21, wherein each of said at least one conductive pattern and said another conductive pattern:

i) is annular in shape, extends less than 360° around said stator and rotor, respectively, and has a length, measured along a circumference of its annular shape, with two ends; and ii) includes a first lead, attached at one end thereof, and a return line attached at an opposite end thereof which extends back along said length to an area adjacent said first lead, terminating at a second lead; wherein the return line on said rotor extends around one of an inner and outer periphery of said another conductive pattern, while the return line on said stator extends around the other of the inner and outer periphery of said at least one conductive pattern.

28. The rotary encoder according to claim 27, wherein the return line on said rotor extends around the inner periphery of said another conductive pattern, while the return line on said stator extends around an outer periphery of said at least one conductive pattern.

29. The rotary encoder according to claim 27, wherein the first and second leads of each respective conductive pattern extend in a radial direction away from their corresponding conductive pattern from a side of their corresponding conductive pattern which contains the return line.

30. A rotary encoder comprising:
a stator having at least one conductive pattern on one side thereof;
a rotor having another conductive pattern on one side thereof which faces said at least one conductive pattern of said stator; and
means for inductively coupling said another conductive pattern on said rotor to said at least one conductive pattern on said stator so as to generate an output signal indicative of the angular position of said rotor to said stator;
wherein each of said at least one conductive pattern and said another conductive pattern:
i) is annular in shape, extends less than 360° around said stator and rotor, respectively, and has a length, measured along a circumference of its annular shape, with two ends; and
ii) includes a first lead, attached at one end thereof, and a return line attached at an opposite end thereof which extends back along said length to an area adjacent to said first lead, terminating at a second lead; wherein the return line on said rotor extends around one of an inner and outer periphery of said another conductive pattern, while the return line on said stator extends around the other of the inner and outer periphery of said at least one conductive pattern.

31. The rotary encoder according to claim 30, wherein the return line on said rotor extends around the inner periphery of said another conductive pattern, while the return line on said stator extends around an outer periphery of said at least one conductive pattern.

32. The rotary encoder according to claim 30, wherein the first and second leads of each respective conductive pattern extend in a radial direction away from their corresponding conductive pattern from a side of their corresponding conductive pattern which contains the return line.

33. The rotary encoder according to claim 30, wherein said output signal generated by said means for inductively coupling is an index pulse, said index pulse being generated once per revolution of said rotor relative to said stator when inductive coupling is maximum.

34. The rotary encoder according to claim 33, wherein said at least one conductive pattern and said another conductive pattern are both annular in shape and asymmetrical about a line drawn through each of their respective centers regardless of the radial position of the line.

35. A rotary motion encoder comprising:
a stator having first and second conductive patterns on one side thereof and a first index pulse pattern radially spaced from said first and second conductive patterns;
a rotor rotatable relative to said stator and having a third conductive pattern facing said first and second conductive patterns and a second index pulse pattern facing said first index pulse pattern, said second index pulse pattern being radially spaced from said third conductive pattern;
means for inductively coupling said third conductive pattern with said first and second conductive patterns to determine the relative angular positions of said rotor relative to said stator; and
means of inductively coupling said first and second index pulse patterns to generate an index pulse once per revolution of said rotor relative to said stator when inductive coupling between said first and second index pulse patterns is maximum.

* * * * *